(12) United States Patent
Johnston, Jr. et al.

(10) Patent No.: US 6,211,539 B1
(45) Date of Patent: Apr. 3, 2001

(54) SEMI-INSULATED INDIUM PHOSPHIDE BASED COMPOSITIONS

(75) Inventors: Wilbur Dexter Johnston, Jr., Mendham; Judith Ann Long, Millburn, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/199,910

(22) Filed: Feb. 22, 1994

Related U.S. Application Data

(63) Continuation of application No. 08/066,605, filed on May 24, 1993, now abandoned, which is a continuation of application No. 07/808,989, filed on Dec. 17, 1991, now abandoned, which is a continuation of application No. 07/515,545, filed on Apr. 26, 1990, now abandoned, which is a continuation of application No. 07/338,506, filed on Apr. 14, 1989, now abandoned, which is a continuation of application No. 07/101,303, filed on Sep. 25, 1987, now abandoned, which is a division of application No. 06/831,113, filed on Feb. 20, 1986, now Pat. No. 4,716,130, which is a continuation-in-part of application No. 06/544,215, filed on Oct. 21, 1983, now abandoned.

(51) Int. Cl.$^7$ ..................................................... H01L 33/00
(52) U.S. Cl. ............................ 257/103; 257/102; 372/45
(58) Field of Search ..................................... 257/103, 102; 372/45

(56) References Cited

U.S. PATENT DOCUMENTS

| H291 | * | 6/1987 | Boos | 357/22 K |
|---|---|---|---|---|
| 4,361,887 | * | 11/1982 | Nakamura et al. | 357/17 |
| 4,593,304 | * | 6/1986 | Slayman et al. | 357/16 |

* cited by examiner

Primary Examiner—Sheila V. Clark
(74) Attorney, Agent, or Firm—Richard J. Botos

(57) ABSTRACT

It has been found that through the use of ferrocene or iron pentacarbonyl based compounds, it is possible to produce semi-insulating epitaxial layers of indium phosphide-based compounds by an MOCVD process. Resistivities up to $1 \times 10^9$ ohm-cm have been achieved as compared to resistivities on the order of $5 \times 10^3$ ohm-cm for other types of semi-insulating epitaxial indium phosphide.

20 Claims, No Drawings

SEMI-INSULATED INDIUM PHOSPHIDE BASED COMPOSITIONS

CROSS REFERENCE TO RELATED APPLICATION

This application is a continuation of application Ser. No. 08/066,605, filed on May 24, 1993, abandoned which is a continuation of Ser. No. 07/808,989, filed on Dec. 17, 1991 (now abandoned), which is a continuation of Ser. No. 07/515,545, filed on Apr. 26, 1990 (now abandoned), which is a continuation of Ser. No. 07/338,506, filed on Apr. 14, 1989 (now abandoned), which is a continuation of Ser. No. 07/101,303, filed on Sep. 25, 1987 (now abandoned), which is a divisional of Ser. No. 06/831,113, filed Feb. 20, 1986, now U.S. Pat. No. 4,716,130, which is continuation in part of Ser. No. 06/544,215 filed Oct. 21, 1983 abandoned.

BACKGROUND OF THE INVENTION

1. Field of the Invention

This invention relates to III-V materials and, in particular, to III-V semi-insulating materials.

2. Art Background

The III-V semiconductor materials such as gallium arsenide, indium phosphide, gallium indium phosphide, indium phosphide arsenide, and gallium indium arsenide phosphide are being utilized and/or have been investigated for various devices. In general, these devices such as laser devices or field effect transistors (FETs) are formed by a series of deposition processes resulting in a layered structure formed on an essentially single crystal substrate. Generally, a region is introduced within the structure to confine or restrict the flow of current to desired device paths, i.e., to device active regions. Various expedients such as a patterned oxide layer or a reverse biased p-n junction are employed for this isolation. However, the oxide layer does not permit epitaxial overgrowth. The p-n junction expedient which does allow overgrowth, nevertheless, yields a resistivity that is highly temperature dependent. Thus, research has been stimulated towards the development of a semi-insulating single crystalline region within the structure since the resistivity of such regions is not strongly temperature dependent and since subsequent overgrowth is possible. Semi-insulating material is generally formed by suitably doping the desired Ill-V semiconductor material. For example, in the formation of gallium arsenide based layers for FET applications, one method of forming a semi-insulating gallium arsenide region involves introducing chromium as a dopant. The chromium doped gallium arsenide layer is generally fabricated by chemical vapor deposition (CVD) growth in a gas transport system. In a typical procedure, a gallium arsenide wafer is heated and a deposition gas is prepared that includes gallium chloride and arsenic compounds such as $As_2$ and/or $As_4$. These materials are transported in a hydrogen stream or in an inert gas stream, e.g., a helium stream. Upon contacting the heated substrate, gallium arsenide is deposited with the release of a chloride containing gas. The reactions involved are, thus, shown in the following equations.

$$GaCl + As_2 \xrightarrow{H_2} GaAs + HCl$$

or $$GaCl + As_2 \xrightarrow{He} GaAs + Cl_2.$$

An appropriate dopant precursor is introduced into the deposition gas stream to produce the desired semi-insulating properties. For example, a chromyl chloride dopant precursor as described in U.S. Pat. No. 4,204,893 issued May 27, 1980 is utilized for producing semi-insulating gallium arsenide. However, chromium compounds are not the only dopant precursors that have been suggested for doping gallium arsenide. Other dopant precursors such as iron pentacarbonyl for gallium arsenide doping have been disclosed. (See U.S. Pat. No. 3,492,175 issued Jan. 27, 1970.)

Indium phosphide has also been formed by a CVD process. In particular, a gas stream including volatile indium halide entities such as $InCl$, $InC_2$, and $In_2Cl_3$ and phosphorus containing entities such as $PH_3$, $P_2$ and $P_4$ are utilized in a hydrogen atmosphere to form indium phosphide and HCl as shown in the following equation.

$$H_2 + \begin{bmatrix} InCl \\ InCl_2 \\ In_2Cl_3 \end{bmatrix} + \begin{bmatrix} PH_3 \\ P_2 \\ P_4 \end{bmatrix} \rightarrow InP + HCl$$

Unlike gallium arsenide deposition, an inert gas carrier system such as a helium carrier system does not result in the deposition of indium phosphide. Since a reducing carrier e.g., a hydrogen carrier, is necessary in conventional CVD of indium phosphide, the dopant precursor employed has been limited to those that do not undergo reduction to produce elemental metals of low volatility. (Premature reduction to a nonvolatile elemental metal by interaction with the carrier gas does not result in dopant incorporation, but instead induces essentially complete depletion of the dopant by formation of the metal on the reactor walls or in the gas phase.) Therefore, only chromium-based dopant precursors have been utilized to form semi-insulating indium phosphide. (See Alferov et al, *Soviet Technical Physics Letters,* 8(6), 296 (1982) and L. A. Ivanyutin and I. N. Tsypleiko, *Elektronnaya Tekhnika,* No. 6, 155, 20 (1981). However, as disclosed by Alferov et al. supra chromium-doped indium phosphide epitaxial layers having resistivities of only approximately $5 \times 10^3$ ohm-cm have been produced. This resistivity level is marginally acceptable for discrete devices such as lasers. However, for arrays of lasers or for integrated circuits, it is highly desirable to have a material with a significantly higher resistivity —a resistivity greater than $10^6$ ohm-cm—to avoid, for example, electrical leakage and undesirable cross coupling of elements in an integrated circuit. Thus, production of suitable resistivities for indium phosphide has not been attained with conventional systems despite the success of these systems for gallium arsenide.

SUMMARY OF THE INVENTION

Indium phosphide having a resistivity up to $1 \times 10^9$ ohm-cm has been produced utilizing a metal organic chemical vapor deposition (MOCVD) procedure in conjunction with an iron pentacarbonyl or ferrocene based dopant precursor. The use of an iron pentacarbonyl or ferrocene based dopant precursor in the formation of indium phosphide through MOCVD results in device quality semi-insulating layers and avoids significant loss of dopant through premature deposition of elemental iron. For example, excellent results are achieved by employing these dopant precursors in conjunction with indium-organic materials such as alkyl indium-alkyl phosphine adducts, e.g., trimethyl indium-trimethyl phosphine adduct, together with additional phosphine. Once the device semi-insulating layers are formed, the device active regions are produced by conventional techniques.

DETAILED DESCRIPTION

The invention involves the use of either a ferrocene or iron pentacarbonyl based dopant precursor (or a combination of such precursors) in conjunction with an indium-organic material to produce growth of a semi-insulating, i.e., resistivity of at least $10^3$ ohm-cm, indium phosphide-based material and ultimately to produce a device. The metal organic deposition of indium phosphide has been extensively described in articles such as "GaAs and Related Compounds," J. P. Duchemin, M. Bonnet, G. Beuchet, and F. Koelsch, *Institute of Physics Conference Series* 45,, 1979, page 45; "International Meeting on the Relationship Between Epitaxial Growth Conditions and the Properties of Semiconductor Epitaxial Layers," A. K. Chatterjee, M. M. Faktor, R. H. Moss, and E. A. D. White, Perpignan, France, 1982. The particular indium-organic material utilized for deposition of the indium phosphide-based material in conjunction with a ferrocene or iron pentacarbonyl based dopant precursor is not critical. Typically, indium alkyls such as trimethyl indium and triethyl indium where the alkyl preferably has 1 to 5 carbon atoms in conjunction with a source of phosphorus, e.g., phosphine, produce indium phosphide of satisfactory quality.

Although it is possible to introduce the alkyl indium materials separately into the gas deposition stream, there are several advantages in first forming an adduct between the indium-organic and an alkyl phosphine such as trimethyl phosphine and/or triethyl phosphine, where the alkyl of the phosphine preferably has 1 to 5 carbon atoms. Solid materials such as trimethyl indium are brought into the gas state through sublimation utilizing a gas stream such as a hydrogen gas stream. Although this introduction method for solid alkyl indium compounds is possible, the maintenance of the vapor concentration in the gas flow at essentially constant levels is difficult. Liquid materials, on the other hand, such as triethyl indium, are introduced by passing a gas flow through a bubbler. However, these materials generally have low vapor pressures, and thus adequate concentration is difficult to attain. Raising the bubbler temperature to avoid this difficulty results in disadvantageous decompositions, while increasing the carrier flow results in incomplete saturation of the gas. In contrast, the adduct of the trialkyl indium compound and the trialkyl phosphine is a low melt point solid that is employable in a stable liquid form at moderately elevated temperatures and that is easily introduced into a gas stream by bubbling a gas such as hydrogen through it. Additionally, the trialkyl indium compounds alone are vigorously pyrophoric while the adduct is not pyrophoric. The adduct is also useful, but not essential as an expedient, for preventing undesirable polymerization of the organo-indium compound.

In a preferred embodiment, the adduct is introduced into the gas stream by flowing a gas, e.g., hydrogen or an inert gas such as nitrogen or helium, through a bubbler containing it. It is desirable that the gas be relatively pure so that impurities are not introduced into the deposited indium phosphide. For example, it is advantageous, although not essential, to employ high purity hydrogen that is further purified by palladium diffusion. Sufficient carrier gas, e.g., hydrogen or an inert gas such as nitrogen or helium, is then flowed through the bubbler to produce a saturated combination of carrier gas and gas-based adduct. (The flow need not necessarily be saturated but much greater control is achieved by utilizing a saturated gas flow. Poor control is, however, particularly undesirable for growing ternary and quaternary indium phosphide-based materials.) Typically, gas flows in the range 50 to 200 sccm are utilized with a bubbler heated to a temperature in the range 60 to 100 degrees C. to produce a saturated gas flow. A controlled sample is employed to determine suitable conditions for producing saturation for a given adduct.

A source of phosphorus, e.g., phosphine, is also introduced into the gas flow. Generally, it is desirable to have a molar excess of phosphorus source, e.g., phosphine, to organic-indium compound of at least 50:1, preferably at least 75:1.

Ratios less than 50:1 generally allow phosphorus escape from the already deposited indium phosphide layer. This escape yields a generally degraded morphology for the deposited indium phosphide. Typically, ratios greater than 100:1, although not precluded, are also not desirable since they are uneconomic.

The dopant precursor, a ferrocene and/or an iron pentacarbonyl based composition, is introduced to yield a mole ratio of iron to indium in the gas stream in the range $1.2 \times 10^{-4}$ to $1 \times 10^{-5}$. Molar ratios significantly higher than $1.2 \times 10^{-4}$ lead to inclusion of a second composition phase in the deposition while molar ratios less than $1 \times 10^{-5}$ lead to insufficient resistivities in deposited indium phosphide-based layers having a background carrier concentration of approximately $2 \times 10^{15}$ cm$^{-3}$. (Indium phosphide having a lower background concentration requires less dopant compensation. Thus, lower ratios for such materials are not precluded.)

A wide variety of iron pentacarbonyl based compositions is employable. For example, an iron pentacarbonyl based composition, such as butadiene iron tricarbonyl, cyclooctatetraene iron tricarbonyl, 1,3-pentadiene iron tricarbonyl, iron pentacarbonyl, cyclohexadiene iron tricarbonyl, cycloheptadiene iron tricarbonyl, cycloheptatriene iron tricarbonyl, cyclopentadienyl iron dicarbonyl dimer, and methylcyclopentadienyl iron dicarbonyl dimer are employable. Similarly, a wide variety of ferrocenes is also employable. For example, compounds such as ferrocene, dimethyl ferrocene, vinyl ferrocene, and butyl ferrocene are also useful. Conventional techniques are utilized to introduce the dopant precursor. For example, in the case of ferrocene, which is a solid at room temperature, a gas flow such as a hydrogen gas flow is passed over the ferrocene to induce sublimation. Typical gas flows in the range 5 to 20 sccm passed over the ferrocene at a temperature in the range 0 to 25 degrees C. produce the desired ratio of indium to iron in the gas stream. For precursors such as iron pentacarbonyl, an effusion source is preferably utilized. In this embodiment, a gas flow, such as a hydrogen gas flow, is first introduced into a gas flow control means such as an electronic mass flow controller or needle valve that is adjusted to yield the desired iron-to-indium ratio and then passed over the effusion source containing the precursor, e.g., iron pentacarbonyl.

Although for pedagogic purposes the deposition has been described in terms of InP, the invention also extends to indium phosphide-based materials in general, i.e., indium phosphide as well as ternary and quaternary systems that include both indium and phosphorus such as indium gallium phosphide, indium phosphide arsenide, indium gallium aluminum phosphide, and indium gallium arsenide phosphide. In these systems, either arsenic and/or gallium and/or aluminum is introduced into the gas stream by expedients such as, respectively, an admixture of $AsH_3$ and use of a bubbler containing alkyl gallium and/or alkyl aluminum compounds such as described in *Journal of Crystal Growth*, 55, 64 (1981), by J. P. Duchemin et al. Formation of device active regions and, indeed completion of the device such as an array of lasers and/or optoelectronic integrated circuit, are then accomplished by conventional techniques.

The following examples are illustrative of the invention.

EXAMPLE 1

A polished indium phosphide substrate, 5, measuring ¾×1 inch and 0.010 inch in thickness was cleaned in methanol and placed on a silicon carbide coated graphite susceptor, 10. This susceptor, together with the substrate, was positioned on the sample holder, 15, through loading port, 20, of a quartz reactor tube measuring 70 mm inside diameter. The susceptor was then moved to the growth position using rod, 25 and magnet, 35. A hydrogen flow was then established over the substrate at a rate of 5.5 l/min. A trimethyl indium/trimethyl phosphine adduct was prepared by mixing the two components in a mole ratio of 1 part trimethyl indium to 1.2 parts trimethyl phosphine. This adduct was purified by sublimation to yield a 1:1 adduct and then placed in a bubbler that was heated to a temperature of 70 degrees C. Approximately 25 grams of ferrocene were placed in a sublimer that was held at 10 degrees C. A 140 sccm flow of hydrogen was passed through the adduct bubbler, and a 20 sccm $H_2$ flow was passed through the sublimer. Then the combined flow was directed through a line that bypassed the reactor. The susceptor was heated by subjecting it to an r.f. power sufficient to raise the substrate temperature to 700 degrees C. as measured by thermocouple, 30. During initial heating when the susceptor reached a temperature of 300 degrees C., a flow of 1000 sccms of a 5 percent by volume mixture of $PH_3$ in $H_2$ was substituted for an equivalent flow of the original hydrogen flow through the reactor. (This initial flow was employed to prevent substrate decomposition.) The r.f. heating was continued until the substrate reached a temperature of 700 degrees C. The r.f. heating was then adjusted to maintain the substrate at this temperature. The combined hydrogen flows were transferred from the bypass line and combined with the $PH_3/H_2$ flow. (These conditions produced an InP growth rate of approximately 2.5 Mm per hour.)

Growth was continued for 90 minutes until the desired InP layer thickness (3.5 $\mu$m) was achieved. Flow through the bubbler and sublimer was then terminated. The substrate was maintained at 700 degrees C. for 2 minutes after flow termination to ensure that all the metal-organic vapor had been removed from the reactor. The r.f. heating was then also terminated and the substrate was allowed to cool. When the substrate temperature reached 300 degrees C., the $PH_3$ flow was eliminated. A hydrogen flow, however, was continued while the substrate was allowed to cool to room temperature. The resulting InP layer had a resistivity of approximately $10^8$ ohm-cm.

EXAMPLE 2

The procedure of Example 1 was employed, except the dopant precursor was iron pentacarbonyl rather than ferrocene. This precursor was introduced utilizing an effusion source at −17 degrees C. with a 20 sccm $H_2$ flow. The resulting layer had a resistivity of approximately $10^8$ ohm-cm.

EXAMPLE 3

A polished indium phosphide substrate measuring ¾×1 inch and 0.010 inch in thickness was cleaned in methanol and placed on a silicon carbide coated graphite susceptor, 10. This susceptor, together with the substrate, was positioned on the sample holder, 15, through loading port, 20, of a quartz reactor tube measuring 70 mm inside diameter. The susceptor was then moved to the growth position using rod, 25, and magnet, 35. A hydrogen flow was then established over the substrate at a rate of 6 l/min.

A trimethyl indium/trimethyl phosphine adduct was prepared by mixing the two components in a mole ratio of 1 part trimethyl indium to 1.2 parts trimethyl phosphine. This adduct was purified by sublimation to yield a 1:1 adduct and then placed in a bubbler that was heated to a temperature of 70 degrees C. Approximately 10 grams of butadiene iron tricarbonyl were placed in a sublimer that was held at −6 degrees C. A 140 sccm flow of hydrogen was passed through the adduct bubbler, and a 5 sccm $H_2$ flow was passed through the sublimer. Then the combined flow was directed through a line that bypassed the reactor. The susceptor was heated by subjecting it to an r.f. power sufficient to raise the substrate temperature to 650 degrees C. as measured by thermocouple, 30. During initial heating when the susceptor reached a temperature of 300 degrees C., a flow of 750 sccm of a 5 percent by volume mixture of $PH_3$ in $H_2$ was substituted for an equivalent flow of the original hydrogen flow through the reactor. (This initial flow was employed to prevent substrate decomposition.) The r.f. heating was continued until the substrate reached a temperature of 650 degrees C. The r.f. heating was then adjusted to maintain the substrate at this temperature. The combined hydrogen flows were transferred from the bypass line and combined with the $PH_3/H_2$ flow. (These conditions produced an InP growth rate of approximately 4 $\mu$m per hour.)

Growth was continued for 60 minutes until the desired InP layer thickness (4 $\mu$m) was achieved. Flow through the bubbler and sublimer was then terminated. The substrate was maintained at 650 degrees C for 2 minutes after flow termination to ensure that all the metal-organic vapor had been removed from the reactor. The r.f. heating was then also terminated and the substrate was allowed to cool. When the substrate temperature reached 300 degrees C., the $PH_3$ flow was eliminated. A hydrogen flow, however, was continued while the substrate was allowed to cool to room temperature. The resulting InP layer had a resistivity of approximately $10^8$ ohm-cm.

EXAMPLE 4

The procedure of Example 3 was followed except cyclooctatetraene iron tricarbonyl was employed rather than butadiene iron tricarbonyl. Additionally, the temperature of the cyclooctatetraene iron tricarbonyl sublimer was 9 degrees C., and the hydrogen flow through the sublimer was 20 sccm. The resistivity of the resulting doped indium phosphide was $6 \times 10^7$ ohm-cm.

What is claimed is:

1. An optoelectronic device or a laser device, said device comprising a substrate, first and second active regions of said device, and a region of semi-insulating indium phosphide based material formed on said substrate and electrically isolating said first active region from said second active region wherein said region of semi-insulating indium phosphide based material is formed by the process that comprises the steps of contacting said substrate with a deposition gas stream characterized in that said substrate has a resistivity less than $10^3$ ohm-cm, said semi-insulating region has a resistivity of at least $10^6$ ohm-cm, said semi-insulating region is epitaxial to said substrate and said semi-insulating region is formed by introducing a dopant precursor comprising a composition chosen from the groups consisting of ferrocene based compositions and iron pentacarbonyl based compositions into said deposition gas stream wherein said deposition gas stream is produced by combining entities including an organo-indium compound and a source of phosphorus whereby current flow is confined to desired device paths.

2. The device of claim 1 wherein said source of phosphorus comprises phosphine.

3. The device of claim 2 wherein said organo-indium compound comprises indium trialkyl.

4. The device of claim 3 wherein said indium trialkyl comprises trimethyl indium.

5. The device of claim 1 wherein said organo-indium compound comprises an indium trialkyl.

6. The device of claim 5 wherein said indium trialkyl comprises trimethyl indium.

7. The device of claim 1 wherein said indium phosphide-based material comprises indium phosphide.

8. The device of claim 1 wherein said device comprises a field effect transistor.

9. The device of claim 2 wherein said device comprises an array of lasers.

10. The device of claim 1 wherein said iron pentacarbonyl based composition comprises a composition chosen from the group consisting of butadiene iron tricarbonyl, cyclooctatetraene iron tricarbonyl, 1,3-pentadiene iron tricarbonyl, cyclohexadiene iron tricarbonyl, cycloheptadiene iron tricarbonyl, cycloheptatriene iron tricarbonyl, cyclopentadienyl iron dicarbonyl dimer, and methylcyclopentadienyl iron dicarbonyl dimer.

11. The device of claim 1 wherein said ferrocene based composition comprises a composition chosen from the group consisting of dimethyl ferrocene, vinyl ferrocene, and butyl ferrocene.

12. The device of claim 1 wherein said dopant precursor comprises a composition chosen from the group consisting of ferrocene and iron pentacarbonyl.

13. The device of claim 12 wherein said source of phosphorus comprises phosphine.

14. The device of claim 13 wherein said organo-indium compound comprises indium trialkyl.

15. The device of claim 14 wherein said indium trialkyl comprises trimethyl indium.

16. The device of claim 12 wherein said organo-indium compound comprises an indium trialkyl.

17. The device of claim 16 wherein said indium trialkyl comprises trimethyl indium.

18. The device of claim 12 wherein said indium phosphide-based material comprises indium phosphide.

19. The device of claim 12 wherein said device comprises a field effect transistor.

20. The device of claim 13 wherein said device comprises an array of lasers.

* * * * *